United States Patent [19]

Fukushima et al.

[11] Patent Number: 4,521,750

[45] Date of Patent: Jun. 4, 1985

[54] CHARACTERISTIC SWITCHING CIRCUIT

[75] Inventors: Isao Fukushima; Kazuyoshi Kuwahara; Keiichi Itoigawa; Yasunori Kobori; Hideo Nishijima, all of Katsuta, Japan

[73] Assignees: Hitachi, Ltd.; Hitachi Microcomputer Engineering, Ltd., both of Tokyo, Japan

[21] Appl. No.: 482,793

[22] Filed: Apr. 7, 1983

[30] Foreign Application Priority Data

Apr. 9, 1982 [JP] Japan .................................. 57-58146

[51] Int. Cl.³ ..................... H03H 11/06; H03H 11/40
[52] U.S. Cl. .................................. 333/28 R; 333/173; 333/213
[58] Field of Search ...................... 333/28 R, 173, 213; 307/520, 521

[56] References Cited

U.S. PATENT DOCUMENTS 4,320,362  3/1982  Bellanger et al. ............... 333/173 X
4,331,944  5/1982  Lee ...................................... 333/213
4,366,455  12/1982 Berger ............................. 333/173 X Primary Examiner—Paul Gensler
Attorney, Agent, or Firm—Antonelli, Terry & Wands

[57] ABSTRACT

A time constant circuit capable of switching the characteristic, which is realized by a combination of an equivalent resistor made up of a switched capacitor and an ordinary capacitor, comprises a capacitor of the switched capacitor or the time constant circuit connected in parallel to a series circuit including a switching device and an additional capacitor. The characteristic is switched by turning on and off the additional capacitor by the switching device. The direct connection of a plurality of equivalent resistors with a plurality of switched capacitors and ordinary capacitors makes up an equalizer. The capacitor making up a switched capacitor is connected with a switching device and an additional capacitor so that the frequency characteristic of the equalizer is switchable by turning on and off the switching device. Each of the capacitors making up the switched capacitors, the capacitors making up the time constant circuits and the additional capacitors has an end thereof grounded. All the elements are thus capable of being formed in the same integrated circuits.

8 Claims, 12 Drawing Figures

CHARACTERISTIC SWITCHING CIRCUIT

The present invention relates to a circut for switching a characteristic, or more in particular to a circuit configuration suitable for switching a characteristic by changing a circuit constant with a combination of switched capacitors.

For example, a magnetic recording and reproduction device such as a video tape recorder or an audio tape recorder, uses an equalizer for attaining a predetermined characteristic frequency spectrum of the reproduction or playback signal. Many magnetic recording and reproduction devices are constructed so that the standard recording and reproduction or the long play mode recording or reproduction is effected by changing the feed rate of the magnetic tape. In devices which are capable of recording and reproduction by switching the feed rate of the magnetic tape, it is necessary to change the characteristics of the equalizer for reproduction of an audio signal as the tape feed rate is changed.

Figure 1:
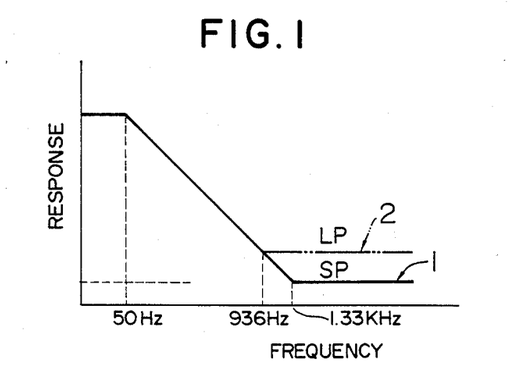
FIG. 1 is a graph showing the frequency characteristics of an equalizer required for reproduction of an audio signal processing circuit used for recording and reproduction by switching the tape feed rate of a magnetic recording and reproduction device.
Figure 2:
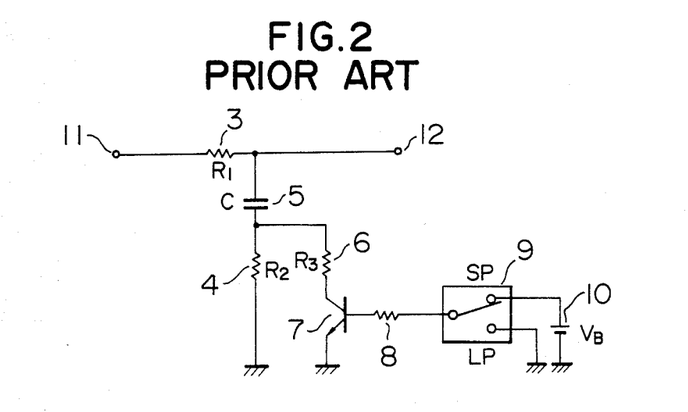
FIG. 2 is a circuit diagram showing an example of a conventional equalizer.

An example of a characteristic of an equalizer used in an audio reproduction circuit of a video tape recorder is shown in FIG. 1. The curve 1 is the frequency characteristic required for reproduction in standard speed recording mode, and the curve 2 the frequency characteristic for reproduction in the long play mode recording mode. FIG. 2, on the other hand, shows a specific example of a time-constant switching circuit for changing the characteristics of a reproduction equalizer such as shown in FIG. 1. In principle, the high frequency side of the characteristic of the equalizer including resistors 3, 4 and a capacitor 5 is changed by connecting a resistor 6 in parallel to the resistor 4. Specifically, in standard play mode, a switch 9 is turned to SP to apply the voltage $V_B$ from a bias source 10 to the base of a switching transistor 7, so that the transistor 7 begins to conduct thereby to connect the resistor 6 in parallel to the resistor 4. The transfer function S representing the frequency characteristic of a time constant circuit with an input at terminal 11 and an output at terminal 12 is given by equation (1) below as is well known.

$$S = \frac{R_P}{R_1 + R_P} \cdot \frac{1 + \frac{1}{j\omega CR_P}}{1 + \frac{1}{j\omega C(R_1 + R_P)}} \simeq \frac{R_P}{R_1} \cdot \frac{1 + \frac{1}{j\omega CR_P}}{1 + \frac{1}{j\omega CR_1}} \quad (1)$$

where $R_1$, $R_2$ and $R_3$ are the values of the resistors 3, 4 and 6 respectively, C the value of the capacitor 5, $R_P$ the parallel resistance value of the resistors $R_2$ and $R_3$, namely, $R_P = R_2 \cdot R_3/(R_2 + R_3)$, and $R_1 \gg R_2, R_3$. The saturation resistance between the collector and emitter of the transistor 7 in conduction is very small and ignorable.

By appropriately selecting the constants, it is possible to attain the equalizer characteristic 1 in standard play mode shown in FIG. 1. In other words, the low cut-off frequency is determined substantially by $1/CR_1$, and the high cut-off frequency by $1/CR_P$. Therefore the values of the resistors and the capacitor may be set from the required cut-off frequencies.

In the long play mode, on the other hand, the low feed rate of the magnetic tape requires emphasis of the high frequency range. Thus, with the switch 9 turned to LP, the base bias of the switching transistor 7 is cut off to turn off the transistor 7, so that the parallel connection of the resistor 6 with the resistor 4 is cancelled to increase the resistance value. As a result, the cut-off frequency for the high frequency range is reduced to a value substantially determined by $1/CR_2$, thereby achieving the equalizer characteristic 2 shown in FIG. 1.

Assume that the circuit as shown in FIG. 2 is constructed of semiconductor integrated circuits. In order to obtain a cut-off frequency of about 50 Hz or 1 KHz as shown in FIG. 1, a large value of the time constant $CR_1$ or $CR_P$ is required. Actually, a large time constant $CR_1$ or $CR_P$ is difficult to obtain which results in an unsatisfactory accuracy. It is difficult to construct the integrated circuits with an economical chip size.

More specifically, in view of the fact that a capacitor occupies a great proportion of the area of the chip and is therefore limited to a maximum of about 200 PF in an integrated circuit construction, capacitors exceeding such a value are provided as a unit outside of the integrated circuit. Even by use of the maximum capacitance of 200 PF constructed in the integrated circuits, it is necessary that the resistor 3 take the value $R_1$ of about 16MΩ, the parallel resistance value $R_P$ $$\left( = \frac{R_2 R_3}{R_2 + R_3} \right)$$

of the resistors 4 and 6 of 6MΩ, and the resistor $R_2$ the value of 9.5MΩ, in order to obtain a circuit constant for achieving the cut-off frequencies of 50 Hz and 1.33 KHz in the circuit of FIG. 2. It is actually impossible to incorporate such a large value of resistors in the integrated circuits. The different processes for forming the resistors and capacitors cause independent variations of the values thereof, with the result that a time constant circuit with an accurate time constant is unrealizable.

Accordingly, it is the object of the present invention to provide a characteristic switching circuit with an accurate time constant which is suitable for integrated circuit construction and capable of switching the time constant appropriately.

According to the present invention, there is provided a characteristic switching circuit wherein the resistor of a time constant circuit includes what is called a switched capacitor providing an equivalent resistor obtained by a combination of a capacitor and a switching circuit. The characteristic is switched by changing the value of the capacitor forming the switched capacitor or the value of the capacitor making up a time constant circuit. According to another aspect of the present invention, the capacitors of the switched capacitors or the switching element for switching the characteristic is arranged ingeniously in such a way that an end of each of the capacitors is grounded, so that the effect of the parasitic capacitance existing in the capacitors of the integrated circuits is eliminated.

Figure 3:
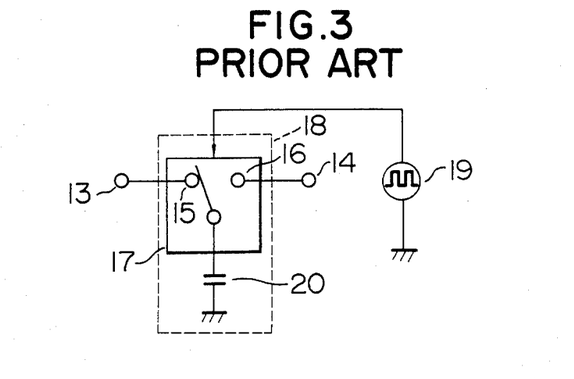
FIG. 3 is a block diagram showing an example of the construction of a switched capacitor used for the present invention.

Prior to the description of an embodiment of the present invention, a general construction of the present invention will be explained. FIG. 3 shows the operating principle of the switched capacitor used in the present invention. An end of a capacitor 20, one end of which is grounded, is connected to a common terminal of a switching element 17. A pair of terminals 15 and 16 for alternate connection are connected to a signal input terminal 13 and a signal output terminal 14 respectively. The switching operation of the switching element 17 is controlled by the output of a clock signal generator 19. In operation, with the contact of the switch 17 connected to the contact 15, the capacitor 20 is charged to the potential of terminal 13. Then, as the contact of the switch 17 is connected to the contact 16, the charge in the capacitor 20 is coupled to the terminal 14.

The voltages at the terminals 13 and 14 are $V_1$ and $V_2$ respectively, the period of the clock signal is T, the frequency is f, and the capacitance of the capacitor 20 is C. The charge of the capacitor 20 with an end thereof connected to the terminal 13 is $CV_1$, while the charge thereof with an end thereof connected to the terminal 14 by the switch 17 is given as $CV_2$. The current I is expressed as $$I = \frac{C}{T}(V_1 - V_2)$$

Thus an equivalent resistor expressed by the equation below is thus considered to have been inserted between the terminals 13 and 14.

$$\text{Req} = \frac{V_1 - V_2}{I} = \frac{1}{Cf} \qquad (2)$$

In view of the fact that the equivalent resistor Req is the reciprocal of the product of the clock frequency f and the capacitance C, the resistance is higher when capacitance is smaller. Thus a high resistance is achieved by occupying a small area in the integrated circuit. For example, if the clock frequency of 100 KHz and the capacitance of 1 PF are involved a resistance of 10MΩ is achieved.

As explained above, the switched capacitor 18 including a capacitor and a switch achieves a high resistance with a small capacitance by properly selecting the clock frequency. Therefore a combination of a switch with a separate capacitor makes possible a time constant circuit of comparative magnitude with a small capacitance. Further, since the circuit includes only capacitors as, primary elements which are constructed in the process of making an integrated circuitry, a high accuracy of the capacitance ratio of the capacitors is obtained with comparative ease. This in turn makes possible the production of a time constant circuit proportionately high in accuracy to the capacitance ratio of the capacitors.

The switch circuit 17, which is illustrated by a symbol of an ordinary switch, is primarily comprised of an active element in an actual integrated circuit and will hereinafter be referred to solely as the switching element.

Figure 4:
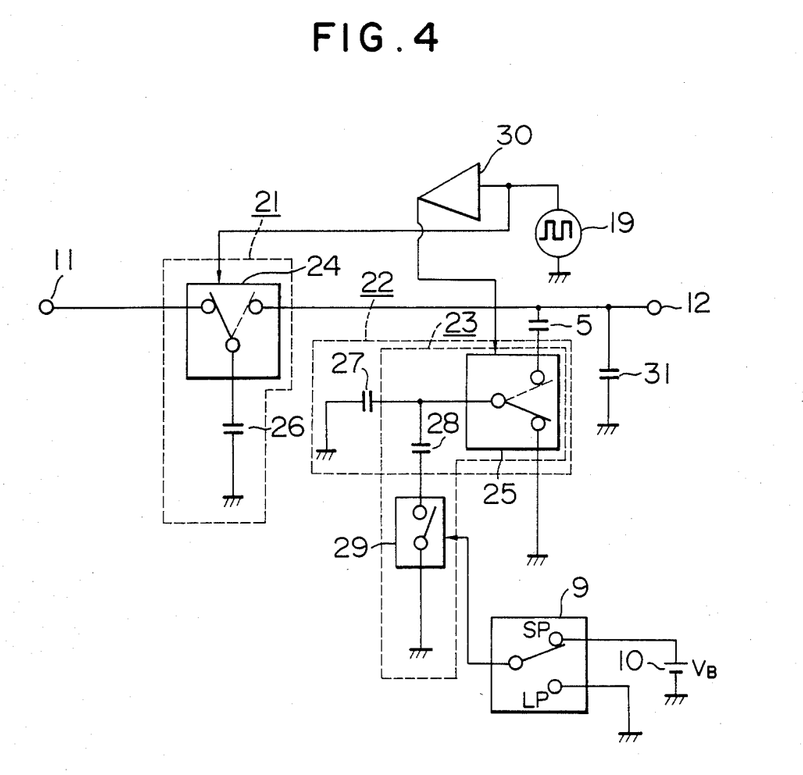
FIG. 4 is a block diagram showing an example of the construction of an equalizer.

FIG. 4 shows an embodiment of the present invention in which the resistors 3, 4 and 6 of the equalizer in FIG. 2 are replaced by switched capacitors respectively.

The switched capacitor 21 including a switching element 24 and a capacitor 26 corresponds to the resistor 3 in FIG. 2; the switched capacitor 22 including a switching element 25 and a capacitor 27 corresponds to the resistor 4 in FIG. 2; and the switched capacitor 23 including a switching element 25 and a capacitor 28 corresponds to the resistor 6 in FIG. 2. In this case, the use of the switching element 25 is shared by the switched capacitors 22 and 23, so that, by switching between SP and LP, the capacitance may be considered to be switched between the sole capacitor 27 and the sum of the capacitors 27 and 28. The switch 29 corresponds to the transistor switch 7 in FIG. 2. The inverter 30 is for causing the operation of the switching elements 24 and 25 in opposite phases in response to the clock signal 19. Numeral 31 designates a hold capacitor for preventing the terminal 12 from opening when the switching elements 24 and 25 are connected as shown by solid line. The capacitor 31 may take such a small value that the signal frequency is not affected by the frequency characteristics thereof.

The above-mentioned construction, in which the resistors 3, 4 and 6 in FIG. 2 are replaced by switched capacitors, provides a circuit completely equivalent to the circuit of FIG. 2 in operating principle. Specifically, $$R_1 = \frac{1}{C_1 f_c}, \ R_2 = \frac{1}{C_2 f_c} \text{ and } R_3 = \frac{1}{C_3 f_c} \text{ from equation (2)}$$

where $f_c$ is the clock signal frequency, and $C_1$, $C_2$ and $C_3$ are the values of the capacitors 26, 27 and 28 respectively. Equation (1) is given as equation (3) below.

$$\frac{R_P}{R_1} \cdot \frac{1 + \frac{1}{j\omega CR_P}}{1 + \frac{1}{j\omega CR_1}} = \frac{C_1}{C_2 + C_2} \cdot \frac{1 + \frac{f_c(C_2 + C_3)}{j\omega C}}{1 + \frac{f_c C_1}{j\omega C}} \qquad (3)$$

Thus, simply by determining the clock frequency $f_c$, the low cut-off frequency is determined by $$\frac{f_c C_1}{C}$$

and the high cut-off frequency by $$\frac{f_c(C_2 + C_3)}{C},$$

so that the frequency characteristic is determined by the capacitances of the capacitors 26, 27 and 28 and the capacitance C of the capacitor 5. When the clock frequency is 100 KHz and the capacitance of the capacitor 26 is 0.5 PF, the equivalent resistance of the switched capacitor 21 is 20MΩ. If a low cut-off frequency of 50 Hz is to be attained, the value of the capacitor 5 is set to 159.1 PF, while a high cut-off frequency of 133 KHz is obtained by setting the capacitance sum of the capacitors 27 and 28 $C_2 + C_3$ to 13.3 PF.

For long play mode recording or reproduction the switch 9 is turned to LP side and the switch 29 is opened to use the capacitor 27 alone. In this case, the high cut-off frequency of 936 Hz as shown by the characteristic of FIG. 1 is attained by setting the value of $C_2$ to 9.36 PF and the value of $C_3$ to 3.94 PF. Thus, capacitance ratio $C_1:C_2:C_3:C$ is set to 1:18.72:7.88:318.2.

This construction permits the time constant circuit to be incorporated in integrated circuits. Further, in view of the fact that the sole circuit elements making up the time constant circuit include the capacitors of the switched capacitors and a fixed capacitor, the time constant being proportional to the ratio therebetween, the problem of variations of the capacitance values is obviated, thus realizing an equalizer of which cut-off frequencies are determined with high accuracy.

In the actual construction of integrated circuits including a fixed capacitor of a time constant circuit or a capacitor of a switched capacitor, the generation of a parasitic capacitance is unavoidable. Depending upon the circuit configuration, the effect of this parasitic capacitance is so great that it is difficult to realize an accurate time constant circuit.

According to the embodiment of the present invention described below, a time constant circuit free of such a parasitic capacitance is obtainable.

Further, the present invention, which is described hereinafter with reference to a time constant circuit, is equally applicable not only to the time constant circuit but also to a circuit for other purposes such as a signal voltage-dividing circuit in which part of the capacitance thereof is switched, to the extent that the circuit is comprised of a combination of switched capacitors.

The present invention will be apparent from the following detailed description taken in conjunction with the accompanying drawings, in which.

Figure 5:
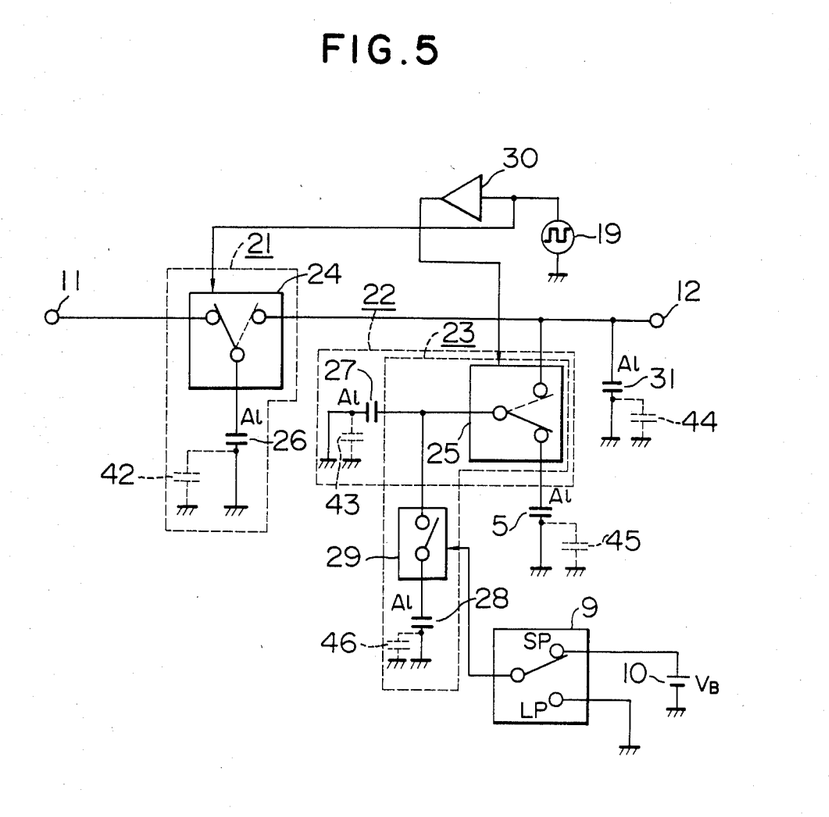
FIG. 5 is a block diagram showing an embodiment of the present invention.

The block diagram of FIG. 5 illustrates an embodiment of the present invention. The features of this circuit are that the capacitor 5 making up a fixed capacitor of the time constant circuit, unlike the fixed capacitor 5 in FIG. 4 which is connected between a line leading to the output terminal 12 and a contact of the switching element is inserted between the other contact of the switching element 25 and ground. The former contact thereof is directly connected to the line leading to the output terminal 12. The capacitor 28 making up the switched capacitor 23, unlike the capacitor 28 of FIG. 4 which is connected between the switch 29 operated by the change-over switch 9 and the command contact of the switch element 25, is connected between the switch 29 and ground. The switch 29 of the circuit of FIG. 5 is directly connected to the common contact of the switching element 25. Further, a specific one of the electrodes of each of these capacitors and the other capacitors 26, 27 and 31 is connected to the ground.

Figure 6:
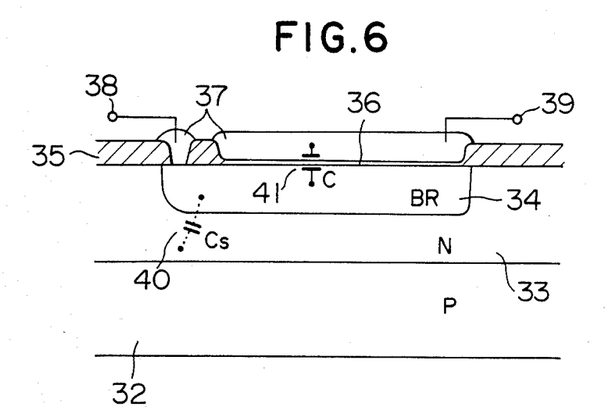
FIG. 6 is a sectional view showing an example of the construction of a capacitor incorporated in integrated circuits.
Figure 7:
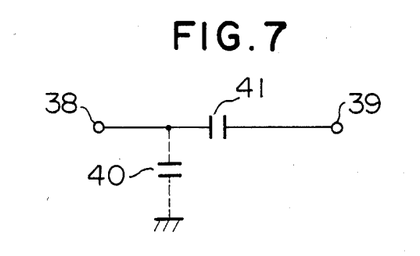
FIG. 7 shows a circuit equivalent to the capacitor in FIG. 6.

Specifically, a capacitor of MOS construction generally incorporated in integrated circuits as shown in FIG. 6 forms a parasitic capacitance, which is grounded in actual applications. This capacitor of MOS construction, as shown, includes a P-type substrate 32, an N-type epitaxial layer 33, a P-type diffusion layer 34, a gate oxide film 36, an aluminum section 37, in which a capacitance 41 is formed between the terminals 38 and 39. Generally, the P-type substrate 32 is connected to a minimum potential of the integrated circuit, and the N-type epitaxial layer 33 is connected to a maximum potential thereof. In view of the construction as shown in FIG. 6, the P-type diffusion layer 34 and the N-type epitaxial layer 33 form a P-N junction, so that a junction capacitance 40 is parasitically formed. Thus, an equivalent circuit of this MOS capacitor as shown in FIG. 7 is obtained. The value of this parasitic junction capacitance 40 is not negligible as compared with the value of the capacitor 41. In addition, this value of the parasitic capacitance is varied according to a value of the voltage applied to the junction. Thus, the capacitance 40 included in the circuit causes a distortion of the signal passing through the circuit. It is therefore necessary that a capacitor be grounded, if required, at the terminal 38 on junction side thereof instead of at the aluminum electrode side thereof.

In the embodiment shown in FIG. 5, the capacitors 5, 31, 26, 27 and 28, which are of MOS type have parasitic capacitances 45, 44, 42, 43 and 46 respectively are all present on the ground side of the capacitors. In this way, the parasitic capacitances are grounded at all times, thus posing no problem. The character Al in the diagram indicates the aluminum electrode side.

If the integrated circuits of FIG. 4 are constructed for basic operation without taking this point into consideration, the electrodes of the capacitors 5 and 28, none of which is grounded, are affected by the parasitic capacitances. In other words, if the aluminum electrode side of the capacitor 5 in FIG. 4 is connected to the output terminal 12, the other terminal thereof, which is connected to the switching element 25, is always grounded through a parasitic capacitance, with the result that normal switching operation by the switching element is made impossible. Assume, on the contrary, that the aluminum electrode side of the capacitor 5 is connected to the switching element 25 and the diffusion layer side thereof to the output terminal 12. A parasitic capacitance with a large voltage dependence is applied in parallel to the hold capacitor 31, thus causing a distortion of the signal being passed or adversely affecting the characteristics associated with the high range frequency. In similar fashion, if the aluminum electrode side of the capacitor 28 is connected to the capacitor 27, the terminal thereof connected to the switching element 29 is grounded always by a parasitic capacitance, so that even when the switching element 29 is opened, the capacitor 28 is not disconnected. If the capacitor 28 is connected the other way, by contrast, a parasitic capacitance large in voltage dependence is applied in parallel to the capacitor 27 which prevents the normal operation of the switched capacitor 22 that otherwise might be performed by the capacitor 27 and the switching element 25. The arrangement of the capacitors 5 and 28 shown in FIG. 5 is completely free of such problems.

Figure 8:
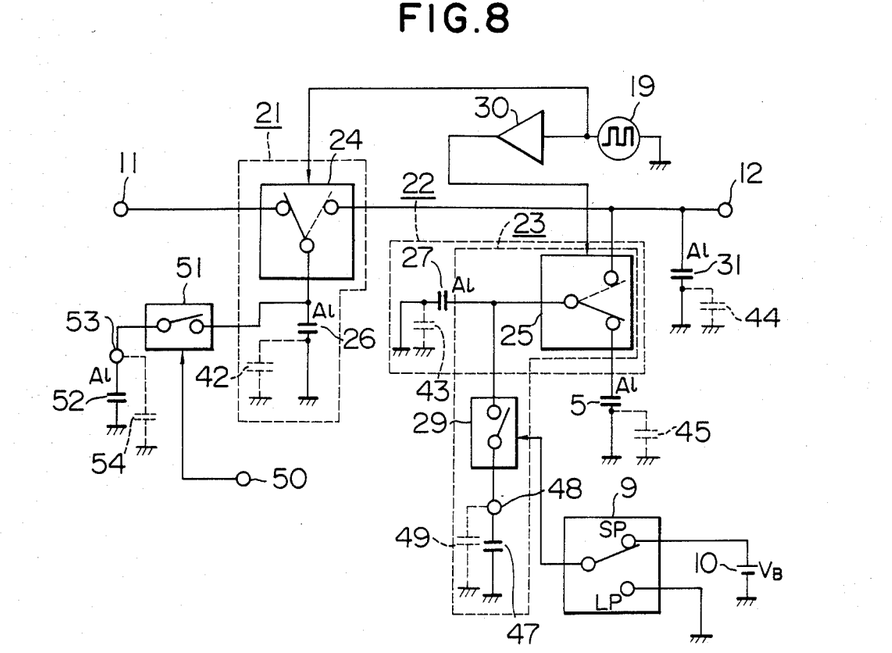
FIG. 8 is a block diagram showing another embodiment of the present invention.

Another embodiment of the present invention is shown in the block diagram of FIG. 8 as an application in which the time constant is greatly changed by use of a large capacitor incapable of being incorporated in the integrated circuits.

In the case where the capacitor connected to a switching element 29 operated for changing the characteristic is of such a large capacity as to make it difficult to fabricate it in an integrated circuit, an external lead terminal 48 for the integrated circuit is provided as shown thereby to connect the capacitor 47 of large capacitance externally. If this terminal 48 is a pin of an integrated circuit, it is connected by bonding a wire from the pad on the integrated circuit. As a result, a parasitic capacitance 49 exists between the pad on the integrated circuit and the chip substrate. If the device is so constructed that, as shown, the capacitor 47 externally added is inserted between the switching element 29 and ground, however, the parasitic capacitance 49 is not connected to the switched capacitor 22 when the switching element 29 is open. In this way, the effect of the parasitic capacitance between the pad and substrate is removed. Although the parasitic capacitance 49 is connected when the switching element 29 is closed, the parasitic capacitance 49 is negligibly small as compared with the capacitor 47 in parallel in view of the construction that the value of the capacitor 47 is so large as not to be incorporated in the integrated circuit.

As a further example, the features of the present invention as shown in FIG. 8 may be utilized also for switching a resistance value made up of the switched capacitor 21. Specifically, an end of a switching element 51, which is adapted to be turned on and off by a control signal applied to a terminal 50, is inserted between the switching element 24 and the capacitor 26, and another capacitor is connected between the other end of the switching element 51 and the earth. In this case, if this additional capacitor is of MOS construction incorporated in the integrated circuit, the aluminum electrode side thereof is connected to the switching element 51 as described above. In the event that a capacitor is added externally of the integrated circuits, on the other hand, the terminal 53 is used as an IC pin connected with the capacitor 52. In this manner, the effect of the parasitic capacitance 54 between the pad and the substrate is eliminated like the parasitic capacitance 49 mentioned above.

Figure 9:
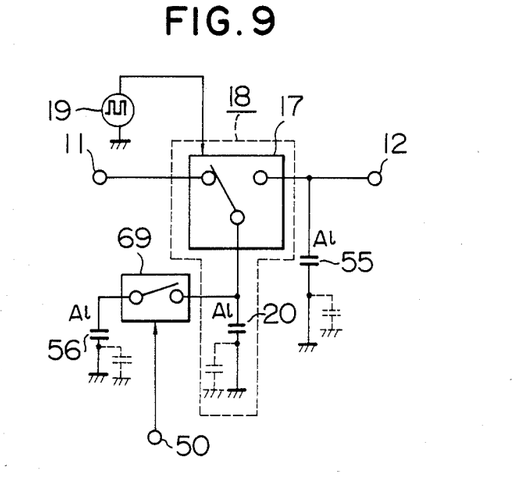
FIGS. 9 to 12 are block diagrams showing other embodiments of the time constant switching circuit according to the present invention.

FIG. 9 shows a still further embodiment for switching the characteristics of a time constant circuit including a switched capacitor 18 combined with a capacitor 55. In this emboidment, an equivalent resistor made up of a combination of a capacitor 20 and a switching circuit 17 controlled by the clock signal from a clock signal generator 19 is combined with a capacitor 55 to construct a low-pass filter. In order to switch the time constant, the switching element 69 is operated by the control signal applied to the terminal 50. In this construction, when the switching element 69 is opened, the capacitor 56 is completely separated from the capacitor 20 and therefore the effect of the capacitor 56 is avoided. The problem which otherwise might occur when the switching element 69 is closed is also completely obviated if the diffusion side of the capacitor 56 is grounded thereby to ground the ends of the parasitic capacitance.

Figure 10:
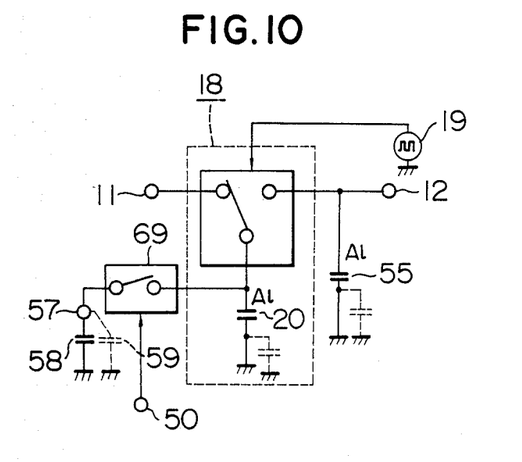

FIG. 10 shows the case in which, in order to change the time constant of the circuit shown in FIG. 9 considerably, a capacitor 58 of such a large value as to be incapable of being incorporated in the integrated circuits is externally provided by use of an IC pin 57. In this case, in spite of the fact that a parasitic capacitance 59 is added between the pad on the IC chip and the substrate, the effect thereof is minimized since the value thereof is sufficiently small as compared with that of the capacitor 58 as in the case described above.

Figure 11:
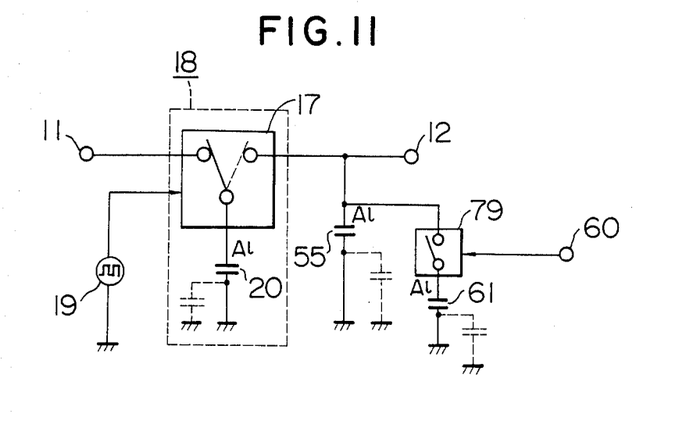

FIG. 11 shows a still further embodiment of the present invention, in which the time constant of a time constant circuit of a low-pass filter is switched by a combination of a switched capacitor and capacitances. As in the previous embodiment a switching element 79 is driven by the control signal applied to the terminal 60 thereby to connect and disconnect the capacitor 61. When the switching element 79 is closed, the capacitor 61 is connected in parallel to the capacitor 55 so that the time constant is switched thereby to reduce the cut-off frequency.

This construction permits the capacitor 61 to be completely separated from the circuit when the switching element 79 is open, thus eliminating the effect of the parasitic capacitance added to the capacitor 61. When the switching element 79 is closed, on the other hand, the effect of the parasitic capacitance of the capacitor 61 is also avoided if the end of the capacitor 61 on diffusion layer side is grounded. As a result, all the capacitors are capable of being formed at the same time in the same process in the integrated circuit, which in turn makes it possible to realize a sufficiently high accuracy of the ratio between the capacitors 20 and 55 and the ratio between the capacitors 20, 55 and 61, so that the time constant of the time constant circuit is switchable with high accuracy to achieve the integrated circuitry of the whole circuit.

Figure 12:
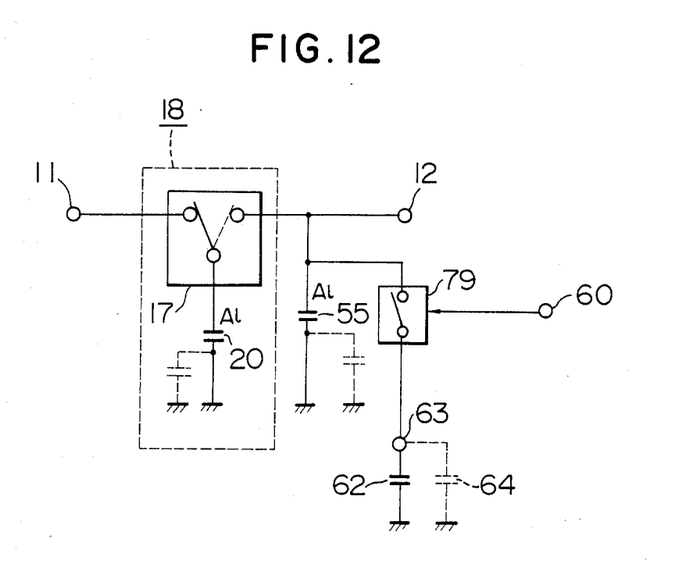

The circuit of FIG. 12 is such that in order to switch the time constant of the circuit of FIG. 11 to a large measure, an IC pin 63 is provided through a switching element 79 to make an external capacitor 62 connectable. As in the preceding emboidments, the effect of the parasitic capacitance 64 between the substrate and the pad on the chip of the integrated circuits is eliminated.

What is claimed is:

1. A circuit having selectable switching characteristics comprising:
   at least one equivalent resistive means for producing a resistance, said resistive means including a first capacitor element having one terminal grounded and a first switching means having first, second and third terminals, another terminal of said first capacitor element being connected with said third terminal of the first switching means, said first switching means being connected between the first and third terminals and between the second and third terminals alternately in response to a clock signal thereby to produce said equivalent resistance between said first and second terminals of the first switching means;
   another capacitor element having one terminal grounded; and
   a second switching means connected between said another terminal of said first capacitor element and another terminal of said another capacitor element, said second switching means being opened or closed by a control signal thereby to change the characteristics of said circuit selectively.

2. A time constant circuit capable of switching characteristics thereof comprising:
   an equivalent resistive means for producing a resistance, said resistive means including a first capacitor element having one terminal grounded and a first switching means having first, second and third terminals, another terminal of said first capacitor element being connected with said third terminal of the first switching means, said first switching means connecting between the first and the third terminals and between the second and the third terminals alternately in response to a clock signal thereby to produce said equivalent resistance between said first and second terminals of the first switching means;

a second capacitor element connected between said second terminal of said first switching means and ground, a time constant circuit being formed by association of said equivalent resistance and said second capacitor element; and a third capacitor element having one terminal grounded; and a second switching means connected between another terminal of said third capacitor element and at least one of the ungrounded terminals of said first and second capacitor elements, said second switching means being opened or closed by a control signal thereby to change the time constant of said circuit selectively.

3. A circuit having selectable switching characteristics thereof comprising:

a pair of equivalent resistive means each for producing a resistance, each of said resistive means including a first capacitor element having one terminal grounded and a first switching means having first, second and third terminals, another terminal of said first capacitor element being connected with said third terminal of the first switching means, said first switching means connecting between the first and the third terminals and between the second and the third terminals alternately in response to a clock signal thereby to produce said equivalent resistance between said first and second terminals of the first switching means;

an input and an output terminal provided on the first and second terminals of one equivalent resistive means, the first terminal of another equivalent resistive means being connected to said output terminal;

a second capacitor element connected between the second terminal of said first switching means of said another equivalent resistive means and ground;

a third capacitor element having one terminal grounded; and a second switching means connected between another terminal of said third capacitor element and said another terminal of said first capacitor element of said another equivalent resistive means, said second switching means being opened or closed by a control signal thereby to change the characteristic of said circuit selectively.

4. A time constant circuit having selectable switching characteristics comprising:

a pair of equivalent resistive means each for producing a resistance, each of said resistive means including a first capacitor element having one terminal grounded and a first switching means having first, second and third terminals, another terminal of said first capacitor element being connected with said third terminal of the first switching means, said first switching means connecting between the first and the third terminals and between the second and the third terminals alternately in response to a clock signal thereby to produce said equivalent resistance between said first and second terminals of the first switching means;

an input and an output terminal provided on the first and second terminals of one equivalent resistive means, the first terminal of another equivalent resistive means being connected to said output terminal;

a second capacitor element connected between the second terminal of said first switching means of said another equivalent resistive means and ground, a time constant circuit being formed by association of said equivalent resistance of said equivalent resistive means and said second capacitor;

a third capacitor element having one terminal grounded; and a second switching means connected between another terminal of said third capacitor element and said another terminal of said first capacitor element of said another equivalent resistive means, said second switching means being opened or closed by a control signal thereby to change the time constant of said circuit selectively.

5. A circuit according to any one of claims 1 to 4 wherein said equivalent resistive means, said switching means and said capacitor elements are formed as integrated circuits on the same substrate with a diffusion layer, and an electrode of the diffusion layer side of said capacitors is grounded.

6. A circuit according to any one of claims 1 to 4, wherein the circuit elements other than said another capacitor element and said third capacitor element are formed as integrated circuits on a same substrate, and a terminal of said second switching means is connected to an external lead terminal of the integrated circuits.

7. An equalizer circuit having a switchable frequency characteristic comprising:

a pair of equivalent resistive means each for producing a resistance, each of said resistive means including a first capacitor element having one terminal grounded and a first switching means having first, second and third terminals, another terminal of said first capacitor element being connected with said third terminal of the first switching means, said first switching means connecting between the first and the third terminals and between the second and the third terminals alternately in response to a clock signal thereby to produce said equivalent resistance between said first and second terminals of the first switching means;

an input and an output terminal provided on the first and second terminals of one equivalent resistive means, the first terminal of another equivalent resistive means being connected to said output terminal;

a second capacitor element connected between the second terminal of said first switching means of said another equivalent resistive means and ground;

a third capacitor element having one terminal grounded; and a second switching means connected between another terminal of said third capacitor element and said another terminal of said first capacitor element of said another equivalent resistive means, said second switching means being opened or closed by a control signal thereby to change the frequency characteristic of said circuit selectively.

8. An equalizer circuit according to claim 7, wherein all of said capacitors are constructed of MOS capacitors formed on the same substrate as semiconductor integrated circuits incorporating said a pair of equivalent resistive means, and an electrode side formed by a diffusion layer of said capacitors is grounded.

* * * * *